(12) United States Patent
Goodner et al.

(10) Patent No.: US 7,030,040 B2
(45) Date of Patent: Apr. 18, 2006

(54) SELECTIVELY GROWING A POLYMERIC MATERIAL ON A SEMICONDUCTOR SUBSTRATE

(75) Inventors: Michael D. Goodner, Hillsboro, OR (US); Grant Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 495 days.

(21) Appl. No.: 10/284,722

(22) Filed: Oct. 31, 2002

(65) Prior Publication Data

US 2004/0087183 A1 May 6, 2004

(51) Int. Cl.
*H01L 21/31* (2006.01)

(52) U.S. Cl. .................................................. 438/780

(58) Field of Classification Search ................ 438/758, 438/778, 780
See application file for complete search history.

(56) References Cited

U.S. PATENT DOCUMENTS 6,670,286 B1 * 12/2003 Yang et al. ................. 438/780

* cited by examiner

*Primary Examiner*—Scott Geyer
(74) *Attorney, Agent, or Firm*—Trop, Pruner & Hu, P.C.

(57) ABSTRACT

A surface may be selectively coated with a polymer using an induced surface grafting or polymerization reaction. The reaction proceeds in those regions that are polymerizable and not in other regions. Thus, a semiconductor structure having organic regions and metal regions exposed, for example, may have the organic polymers formed selectively on the organic regions and not on the unpolymerizable or metal regions.

16 Claims, 2 Drawing Sheets

SELECTIVELY GROWING A POLYMERIC MATERIAL ON A SEMICONDUCTOR SUBSTRATE

BACKGROUND

This invention relates generally to processes for manufacturing semiconductor integrated circuits.

In some instances during the manufacturing process, a semiconductor integrated circuit may have two exposed surface regions. The two surface regions may have different characteristics. It may be desirable to form materials onto one of the regions and not the other of them.

Typically, providing a selective coating on a substrate involves depositing a polymeric coating on the entire substrate and selectively removing the polymeric coating, using standard lithographic and etching patterning, from the regions where the coating is not desired. However, these techniques require tight alignment to leave the coating only on the desired portions of the substrate.

Thus, there is a need for better ways to selectively form materials on semiconductor structures.

DETAILED DESCRIPTION

Figure 1:
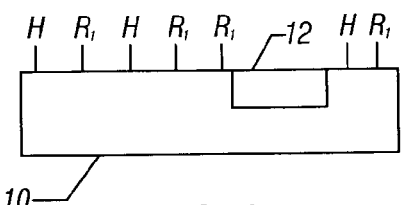
FIG. 1 is a schematic depiction of a precursor material in accordance with one embodiment of the present invention.

In accordance with various embodiments of the present invention, a semiconductor wafer may include a semiconductor substrate having a dielectric material 10, such as an interlayer dielectric (ILD), formed thereon. The material 10 may be exposed on an upper surface. Also exposed thereon is a disparate material 12, such as a metal material, as indicated in FIG. 1. Thus, it may be desirable to have a polymer formed selectively only over the material 10 and not over the material 12.

Through surface grafting, polymers may be caused to attach to materials with abstractable hydrogen. These materials with easily abstractable hydrogen may be known as proton donors and examples include organic materials or materials with organic moieties. Conversely, materials, such as a metal, have no such easily abstractable hydrogen and, therefore, will not be subject to induced photografting or polymerization.

As a result, the polymerization can be caused to occur selectively on the surface where easily abstractable hydrogen is available. In regions without such abstractable hydrogen, no such polymerization will occur. As a result, the polymer may be formed selectively on the surface in some regions and not in others. In some embodiments this may avoid unnecessary photo etching and masking steps, decreasing the cost of the semiconductor processing.

A variety of techniques may be utilized to induce surface grafting and polymerization. For example, photo induced graft polymerization may be achieved using benzophenone moieties. Other examples include radical photopolymerization, hydrogen abstraction on organic surfaces with molecules other than benzophenone, cationic and anionic polymerizations, and azide functionalization, to mention a few examples. In general, it is desirable to induce polymerization on regions that are polymerizable while avoiding polymerization on regions, such as metals, that are not polymerizable.

Figure 2:
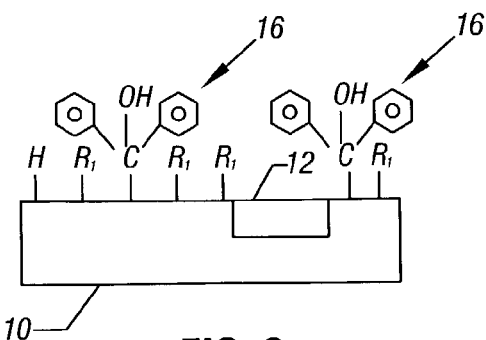
FIG. 2 is a schematic depiction of a subsequent precursor material in accordance with one embodiment of the present invention.

In accordance with one embodiment of the present invention, photo induced graft polymerization may be implemented using benzophenone. Referring to FIG. 1, a material 10, that has abstactable hydrogen, may have a surface chemistry including hydrogen (H), and organic molecules, in any of a variety of forms. The material 10 may be coated with a solution of benzophenone and irradiated using ultraviolet radiation at 340 nanometers, in accordance with one embodiment of the present invention. Other wavelengths may also be used such as 365 nm. Ultraviolet radiation breaks down the double bond between the carbon and the oxygen forming a benzophenone derivative reactable with a variety of other organic moieties. Thus, as shown in FIG. 2, as a result of the breakdown of the benzophenone solution, ketal moieties 16 may be attached in place of some of the hydrogen moieties (H) previously present on the surface of the material 10.

Advantageously, the benzophenone solution is provided in a solvent with poor proton donor activity such as benzene. In addition, the solvent is advantageously transparent at the illumination intensities that are utilized.

Of course, the material 12 surface does not react with the benzophenone via the ultraviolet induced hydrogen abstraction mechanism. Only the organic materials or materials with an abstractable hydrogen are functionalized. The wafer may then be washed with an appropriate rinse solution, such as acetone or methanol, to mention a few examples, to remove excess benzophenone.

Figure 3:
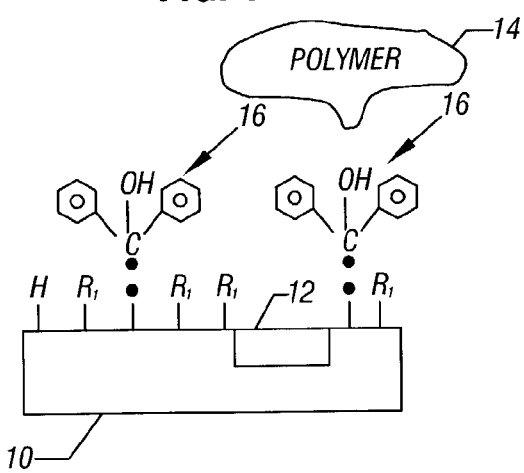
FIG. 3 is a schematic representation of a subsequent precursor material in accordance with one embodiment of the present invention.
Figure 4:
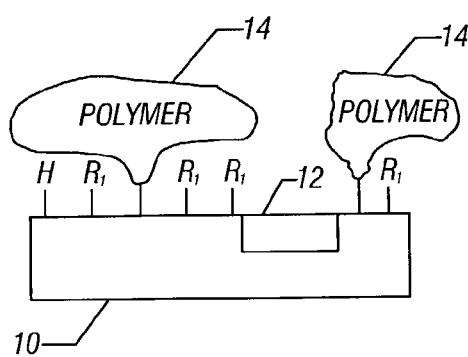
FIG. 4 is a schematic depiction of a grafted polymer in accordance with one embodiment of the present invention.

Next, as shown in FIGS. 3 and 4, a coating material that is susceptible to free radical polymerization is coated over the wafer and the wafer is, again, exposed to ultraviolet light. The free radical benzophenone ketal moieties 16 then serve as a surface photoinitiator, causing in situ polymerization of the coating material. The coating material may include, as examples, simple vinyl monomers such as methyl methacrylate or vinyl functionalized engineering polymers, such as an acrylate endcapped polyimide, such as Amoco Ultradel 7501. The methyl methacrylate may form poly(methyl methacrylate).

A solvent rinse after exposure removes any unreacted coating material. A polymer coating 14 is selectively grown on the material 10 as shown in FIG. 4.

In general, a compound having a double bond that is susceptible to polymerization, such as free radical polymerization, as an example, may be utilized to form the polymer coating 14 and to replace the ketal moieties 16 shown in FIG. 3.

Figure 5:
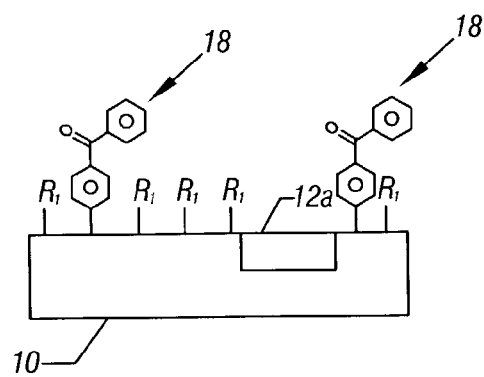
FIG. 5 is a schematic depiction of a precursor material in accordance with another embodiment of the present invention.
Figure 6:
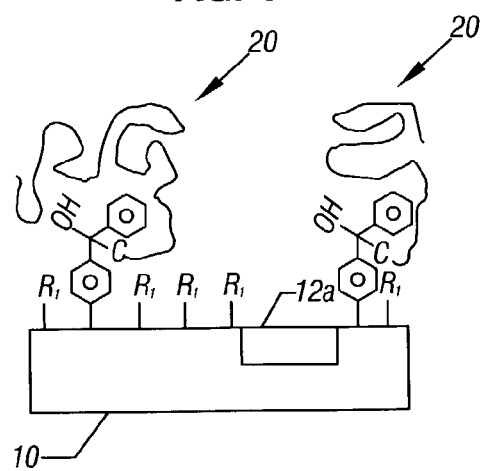
FIG. 6 is a schematic depiction of a grafted polymer in accordance with one embodiment of the present invention.

As another example, shown in FIGS. 5 and 6, a single step method may be utilized to selectively grow polymer coatings selectively on the material 10. The material 10 is functionalized with moieties 18, such as benzophenone or azide moieties, coated on the wafer, and patterned with metal lines 12a to form a mixed substrate as shown in FIG. 5.

The wafer may then be coated with a precursor material and exposed to ultraviolet light. The precursor material may be, for example, vinyl monomers or vinyl functionalized engineering polymers, as described previously. The polymerization may occur in the same manner to grow the polymeric coating 20 selectively on the organic portions of the exposed substrate as shown in FIG. 6.

Alternatively, the precursor material may consist of an engineering polymer that has abstractable hydrogen. The coating may be grown through hydrogen abstraction by benzophenone moieties. A solvent may be utilized to remove unreactive material, leaving the polymer coating 20 over the organic portions of the substrate, as shown in FIG. 6.

As an example of an application of the technology described herein, an air gap interconnect structure may use the selective formation of polymers on an exposed surface. In some embodiments it is possible to create an unlanded via. A landed via is a via which has a bottom end completely adjacent to a metal structure below. An unlanded via is a via with the bottom end only partially adjacent to underlying metal structures, allowing possible overlap onto underlying dielectric structures such as ILD or sacrificial material. Unlanded vias are preferred for some integrated circuit manufacture design rules, as they allow relaxed alignments and tolerances for expensive processing steps such as photolithography. However, in some processing schemes, landed vias are necessary to provide a feasible fabrication technique.

In the case of air gap structures, some processing schemes require landed vias, as the material surrounding the metal structures on the substrate is air, after a sacrificial material has been removed to form the air gap; etching of subsequent unlanded via holes would punch through the overlying dielectric material, allowing subsequently applied materials to fill the air gap. Process flows using patterned etch stop materials avoid punch-through, but the etch stop must be perfectly aligned to the underlying metal structures.

Figure 7:
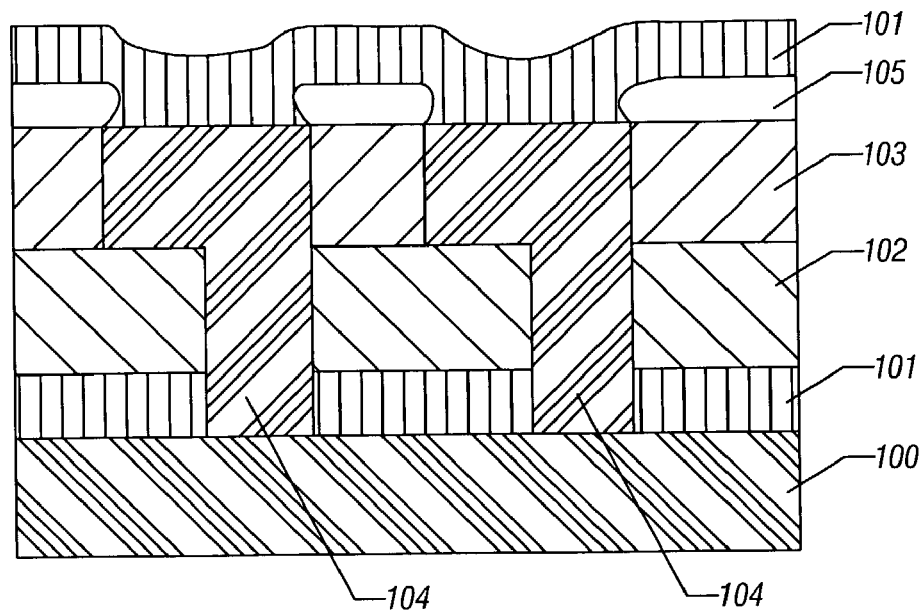
FIG. 7 is an enlarged cross-sectional view of one embodiment of the present invention.

Referring to FIG. 7, a semiconductor substrate 100 may be covered by a porous hard mask 101. A via level dielectric 102 may be positioned over the hard mask 101 and a sacrificial material 103, such as a thermally decomposing layer, may be provided over the dielectric 102. Formed through the layers 101, 102, and 103 are a plurality of L-shaped metal lines, vias, or feature 104. Over the metal feature 104 and the sacrificial material 103, the polymer material 105 may be selectively deposited.

The material 105 may be deposited over the dielectric 103 and not over the metal feature 104 using the techniques described herein. Subsequently, the porous hard mask 101 may be formed over the metal via 104 and the surface polymerized etch stop material 105.

Figure 8:
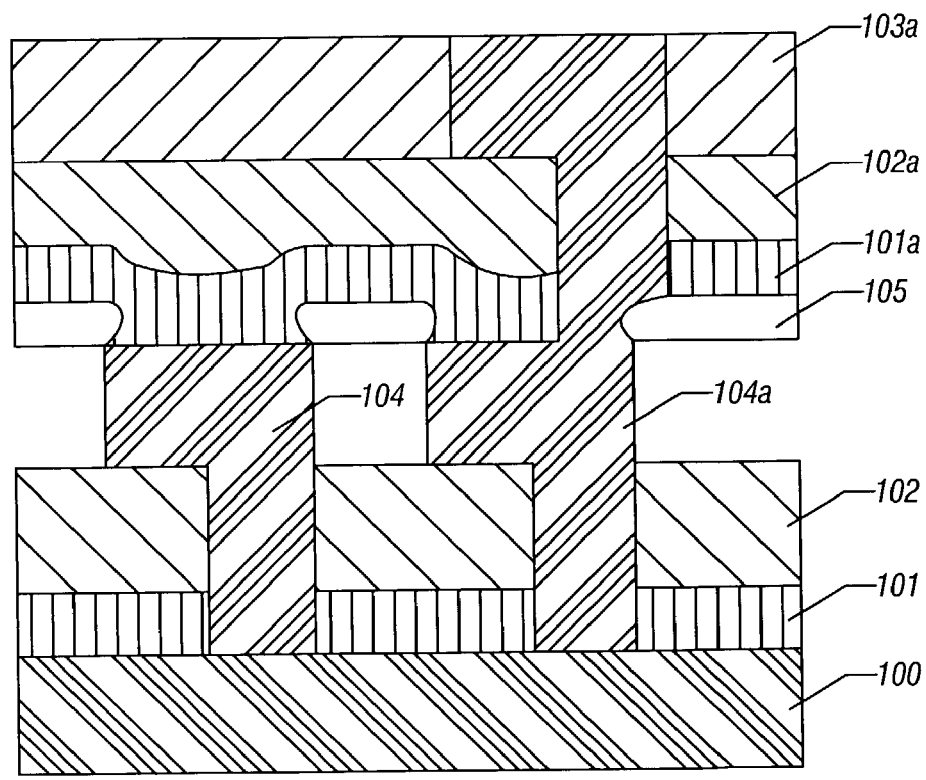
FIG. 8 is an enlarged cross-sectional view of the embodiment shown in FIG. 7 at a subsequent stage of manufacture.

As shown in FIG. 8, a plurality of layers may be formed over the etch stop material 105. Another via level dielectric 102a and an additional sacrificial material 103a may be formed. Then a metal line and via 104a may be formed completely through the upper layers 103a, 102a, 101a, and 105 to connect to the metal line 104 in the lower layers. In this case, the surface polymerized etch stop material 105 enables the formation of an unlanded via 104a.

In one embodiment, after the layer 102a is formed, an opening may be etched using suitable masking techniques. The opening would extend straight down and into the region 103 but for the imposition of the etch stop material 105. Thus, the structure may be formed after the sacrificial layer 103 has been removed (as illustrated in FIG. 8) without being affected by the etch, due to the protection afforded by the etch stop material 105. Since the etch stop material 105 can be formed selectively over the non-metallic surfaces using the techniques described herein, it is possible to easily provide the needed masking to enable unlanded vias to be formed.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a semiconductor substrate having a first exposed polymerizable surface and a second exposed unpolymerizable surface; and
   causing polymerization to occur selectively on the polymerizable surface while avoiding polymerization on the unpolymerizable surface to form a surface coating that selectively covers the polymerizable surface.

2. The method of claim 1 wherein forming a semiconductor substrate includes forming a semiconductor substrate having a second exposed unpolymerizable surface formed of metal.

3. The method of claim 2 wherein forming a semiconductor substrate having a first exposed polymerizable surface includes forming a surface of interlayer dielectric.

4. The method of claim 1 wherein causing polymerization to occur selectively includes surface grafting polymers to the polymerizable surface.

5. The method of claim 1 wherein causing polymerization to occur includes initiating photo induced graft polymerization.

6. The method of claim 5 including coating said substrate with a substance to induce photo surface grafting and polymerization.

7. The method of claim 6 including coating said surface with benzophenone and irradiating using ultraviolet radiation.

8. The method of claim 7 including forming a benzophenone solution and a solvent that is transparent.

9. The method of claim 6 including forming a benzophenone derivative attached to said polymerizable surface through a hydrogen moiety.

10. The method of claim 9 including using a benzene solvent for said benzophenone solution.

11. The method of claim 5 including exposing said substrate to a coating material that is susceptible to free radical polymerization.

12. The method of claim 11 including initiating in situ polymerization of the coating material.

13. The method of claim 12 including providing a compound having a double bond as said coating material.

14. A method comprising:
    forming a first metal section extending through layers of dielectric;
    selectively forming a polymer on said exposed first metal section and not on said dielectric;
    covering said polymer with additional dielectric layers; and
    forming a second metal section through said additional dielectric layers to said first metal section.

15. The method of claim 14 including using said polymer as an etch stop for the etch through said dielectric layers to form said second via section.

16. The method of claim 14 including forming an unlanded via.

* * * * *